(12) United States Patent
Baik et al.

(10) Patent No.: US 8,562,086 B1
(45) Date of Patent: Oct. 22, 2013

(54) RAIL SYSTEM FOR SUPPORTING EQUIPMENT IN A RACK

(75) Inventors: David J. Baik, Sunnyvale, CA (US); David Willheim, Los Gatos, CA (US); Russell Read, Round Rock, TX (US); Dave Howard, Austin, TX (US)

(73) Assignee: NetApp, Inc., Sunnyvale, CA (US)

( * ) Notice: Subject to any disclaimer, the term of this patent is extended or adjusted under 35 U.S.C. 154(b) by 191 days.

(21) Appl. No.: 13/095,310

(22) Filed: Apr. 27, 2011

(51) Int. Cl.
*A47B 88/00* (2006.01)

(52) U.S. Cl.
USPC ..................... 312/334.4; 312/223.1

(58) Field of Classification Search
USPC .......... 312/334.4, 265.1, 265.4, 223.1, 334.5, 312/334.7, 334.8, 334.1; 211/26, 191, 192; 248/220.41, 220.22, 221.11, 429, 248/298.1; 403/321–325
See application file for complete search history.

(56) References Cited

U.S. PATENT DOCUMENTS

| | | | |
|---|---|---|---|
| 4,771,901 A * | 9/1988 | Griswold et al. ............. | 211/151 |
| 6,681,942 B2 | 1/2004 | Haney | |
| 6,863,188 B2 | 3/2005 | Besserer et al. | |
| 7,144,184 B1 * | 12/2006 | Tsai .............................. | 403/350 |
| 7,357,362 B2 * | 4/2008 | Yang et al. ............... | 248/221.11 |
| 7,694,926 B2 | 4/2010 | Allen et al. | |
| 7,699,279 B2 * | 4/2010 | Chen et al. ................ | 248/220.41 |
| 7,703,734 B2 * | 4/2010 | Chen et al. ................ | 248/298.1 |
| 7,731,142 B2 * | 6/2010 | Chen et al. .................... | 248/244 |
| 7,878,468 B2 * | 2/2011 | Chen et al. ............... | 248/220.41 |
| 7,930,812 B2 * | 4/2011 | Curnalia et al. ............. | 29/426.6 |
| 8,371,454 B2 * | 2/2013 | Chen et al. ........................ | 211/26 |
| 8,403,434 B2 * | 3/2013 | Yu et al. ..................... | 312/334.1 |
| 2005/0156493 A1 * | 7/2005 | Yang et al. ................ | 312/334.5 |
| 2005/0274680 A1 * | 12/2005 | Allen et al. ..................... | 211/26 |
| 2008/0067907 A1 * | 3/2008 | Chen et al. .................... | 312/312 |
| 2008/0073469 A1 * | 3/2008 | Mushan et al. ............ | 248/205.1 |
| 2008/0230496 A1 | 9/2008 | Henderson et al. | |
| 2010/0200523 A1 | 8/2010 | Henderson | |
| 2011/0240580 A1 * | 10/2011 | Yu et al. ........................ | 211/183 |

* cited by examiner

*Primary Examiner* — Darnell Jayne
*Assistant Examiner* — Hiwot Tefera
(74) *Attorney, Agent, or Firm* — Klein, O'Neill & Singh, LLP (57) ABSTRACT

A rail system for supporting equipment in a rack is disclosed. The rail system may include: a first support rail assembly extending between a pair of vertical columns; a second support rail assembly extending between a different pair of vertical columns. Each support rail assembly may include: a support rail having opposite ends; aligners configured to align the opposite ends of the support rail with apertures of vertical columns; and mounting plates configured to removably secure the aligners to the opposite ends of the support rail. At least one mounting plate may be further configured to define at least one receiving portion for receiving a fastener for securing an equipment supportable in the rack.

17 Claims, 12 Drawing Sheets

RAIL SYSTEM FOR SUPPORTING EQUIPMENT IN A RACK

TECHNICAL FIELD

The disclosure generally relates to support rails, and more particularly to a rail system for supporting components in a rack.

BACKGROUND OF THE INVENTION

Various types of racks may be provided for supporting equipment such as computers, servers, routers or the like. Most racks may include multiple vertical columns. Each vertical column may have multiple apertures defined thereof for receiving horizontal support rail assemblies. For example, four vertical columns may be provided to define corners of a rectangular equipment rack. One support rail assembly may only be mounted horizontally and extend between a pair of vertical columns on a left side of the rectangular rack; another support rail assembly may only be mounted horizontally and extend between another pair of vertical columns on a right side of the rectangular rack. The support rail assemblies may include support panels or shelves for receiving and supporting equipment in the rack.

Various devices and designs may be utilized for securing the support rail assemblies to the vertical columns. However, the known designs may be complicated and time consuming to install. Furthermore, different equipment racks may be configured differently. For example, the apertures on the vertical columns may vary in size and/or shape depending on the particular rack manufacturer. In addition, certain devices supported in the rack may include fasteners that need to be secured to the support rail assemblies for additional security. These fasteners supplied with such certain devices may also vary in size and/or shape. Differences in rack configurations and/or fastener types may therefore further complicate the design of the support rail assemblies.

SUMMARY OF THE INVENTION

The present disclosure is directed to a rail system for supporting equipment in a rack. The rail system may include two rail assemblies that are physically identical, with one being oriented in an opposing side with respect to another when installed in the rack. The identical rail assemblies may eliminate the need for different left side and right side designs and may reduce installation time of the rail system.

Each rail assembly includes a support rail, a set of aligners and a set of mounting plates. The support rail is configured to extend between a pair of vertical columns of the rack. The aligners are configured to align the opposite ends of the support rail with apertures on vertical columns. The mounting plates are configured to removably secure the aligners to the opposite ends of the support rail. The mounting plates may be further configured to define receiving portions for receiving fasteners for securing equipment supportable in the rack.

Additional sets of aligners may be provided to accommodate for different types of vertical column apertures. Each set of aligners may be configured to engage with a particular type of aperture, allowing a user to choose the appropriate aligners based on the size, shape (e.g., square, rectangular, round or the like), or thread pattern (e.g., threaded or unthreaded) of the apertures on the vertical columns of the rack.

Furthermore, additional sets of mounting plates may also be provided to accommodate for different types of screws associated with the equipment supportable in the rack. Each set of mounting plates may be configured for receiving a particular type of screw which allows the user to select an appropriate mounting plates based on the type of screw associated with the equipment.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1 through 9, a rail system 100 having a first rail assembly 102 and a second rail assembly 104 is shown. The rail system 100 may be installed in a rack 106. The rack 106 may include four vertical columns 108, 110, 112 and 114 defining corners of the rack 106. Each vertical column may include multiple apertures 116. The first rail assembly 102 may be mounted horizontally and extend between vertical columns 108 and 110 on one side of the rack 106. The second rail assembly 104 may be mounted horizontally and extend between vertical columns 112 and 114 on the opposite side of the rack 106.

Figure 1:
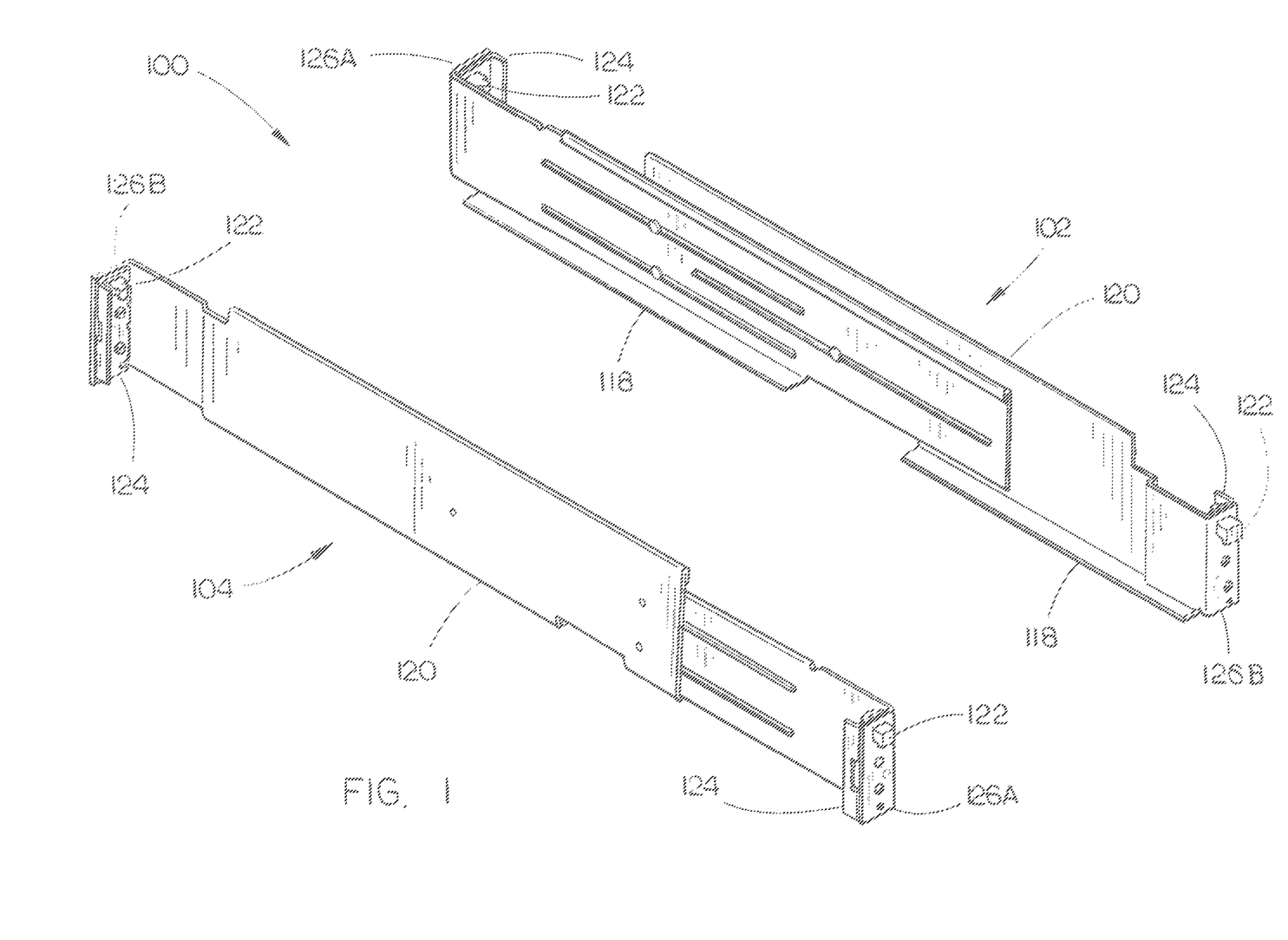
FIG. 1 is an isometric view of a rail system of the present disclosure.
Figure 2:
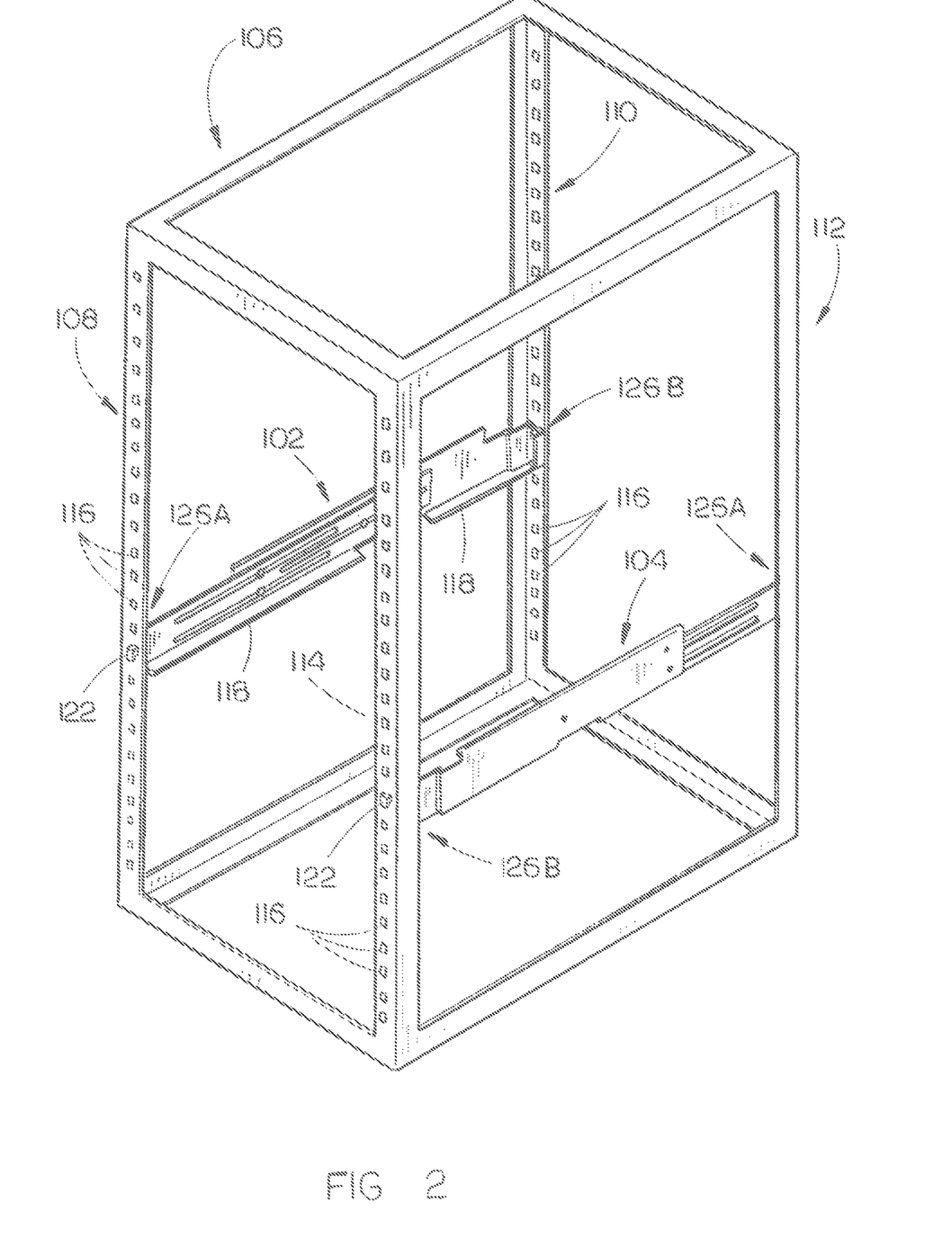
FIG. 2 is an isometric view of the rail system of FIG. 1 installed in a rack.
Figure 3:
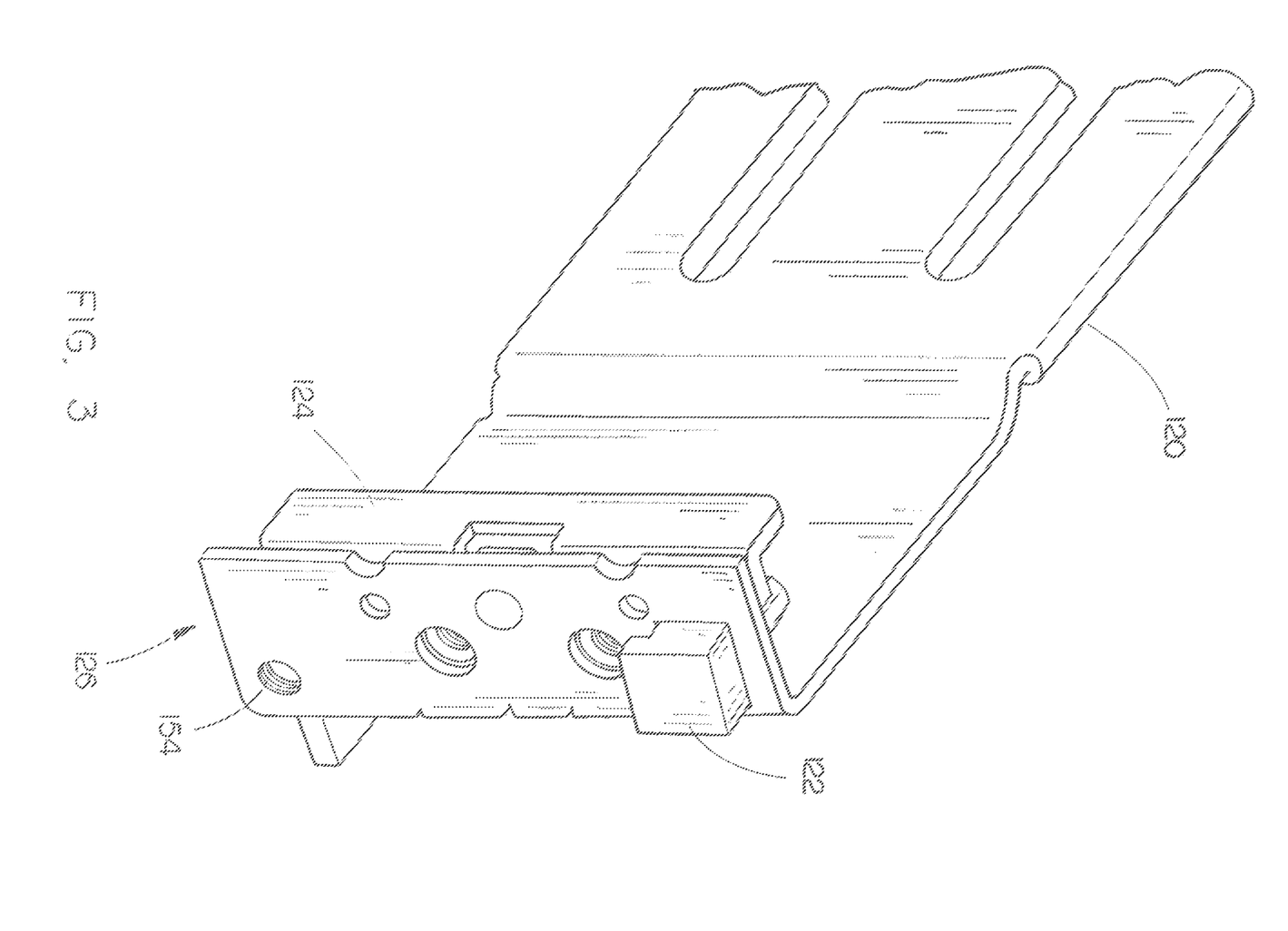
FIG. 3 is a partial isometric view of an end of a support rail with an aligner and a mounting plate attached.

As illustrated in FIGS. 1 and 2, the first rail assembly 102 and the second rail assembly 104 are physically identical, with one being oriented in an opposing side with respect to another. The design of rail assemblies 102 and 104 eliminates the need for different left side and right side assemblies and may also reduce installation time.

Figure 4:
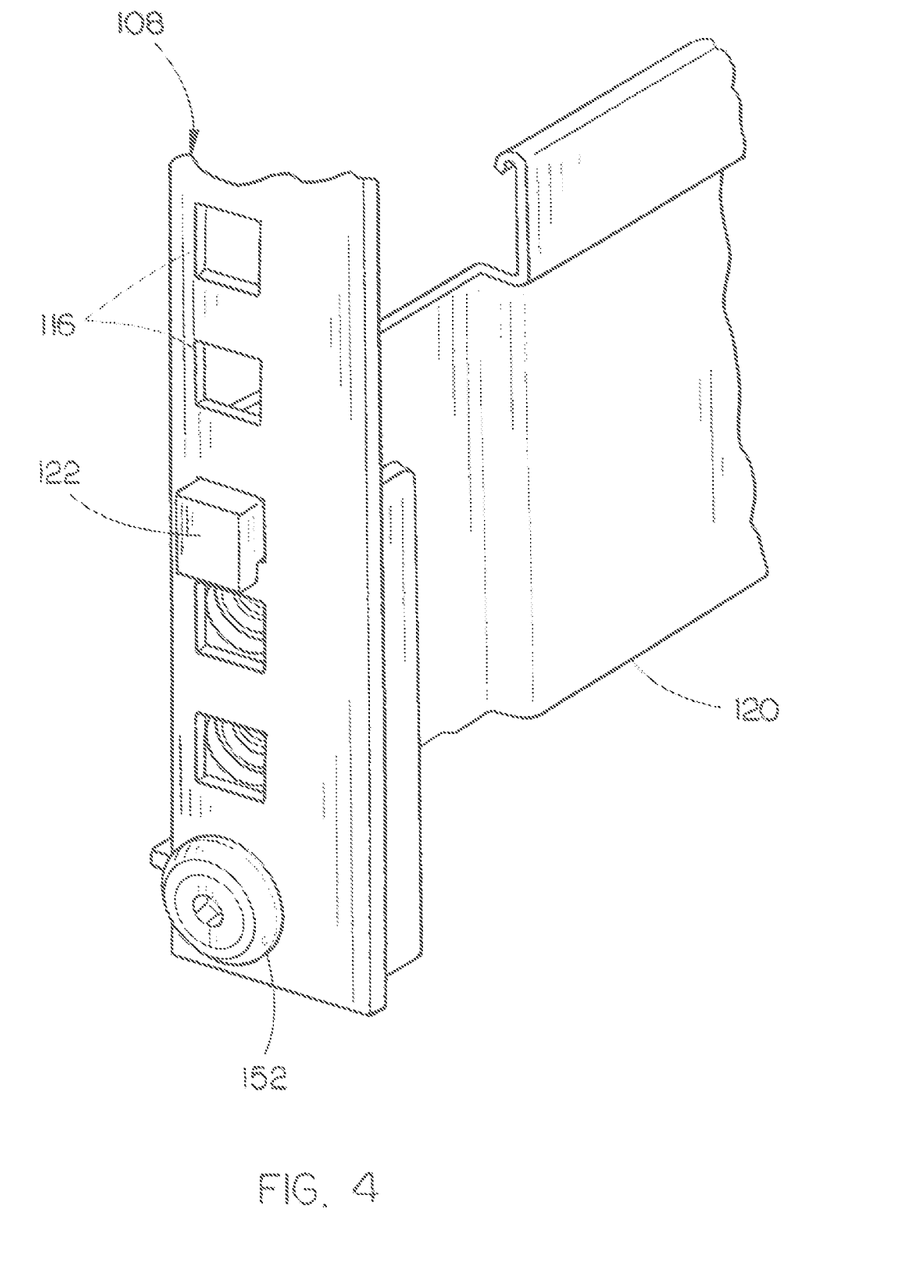
FIG. 4 is a partial isometric view of an end of a support rail aligned and secured to a vertical column of a rack.
Figure 5:
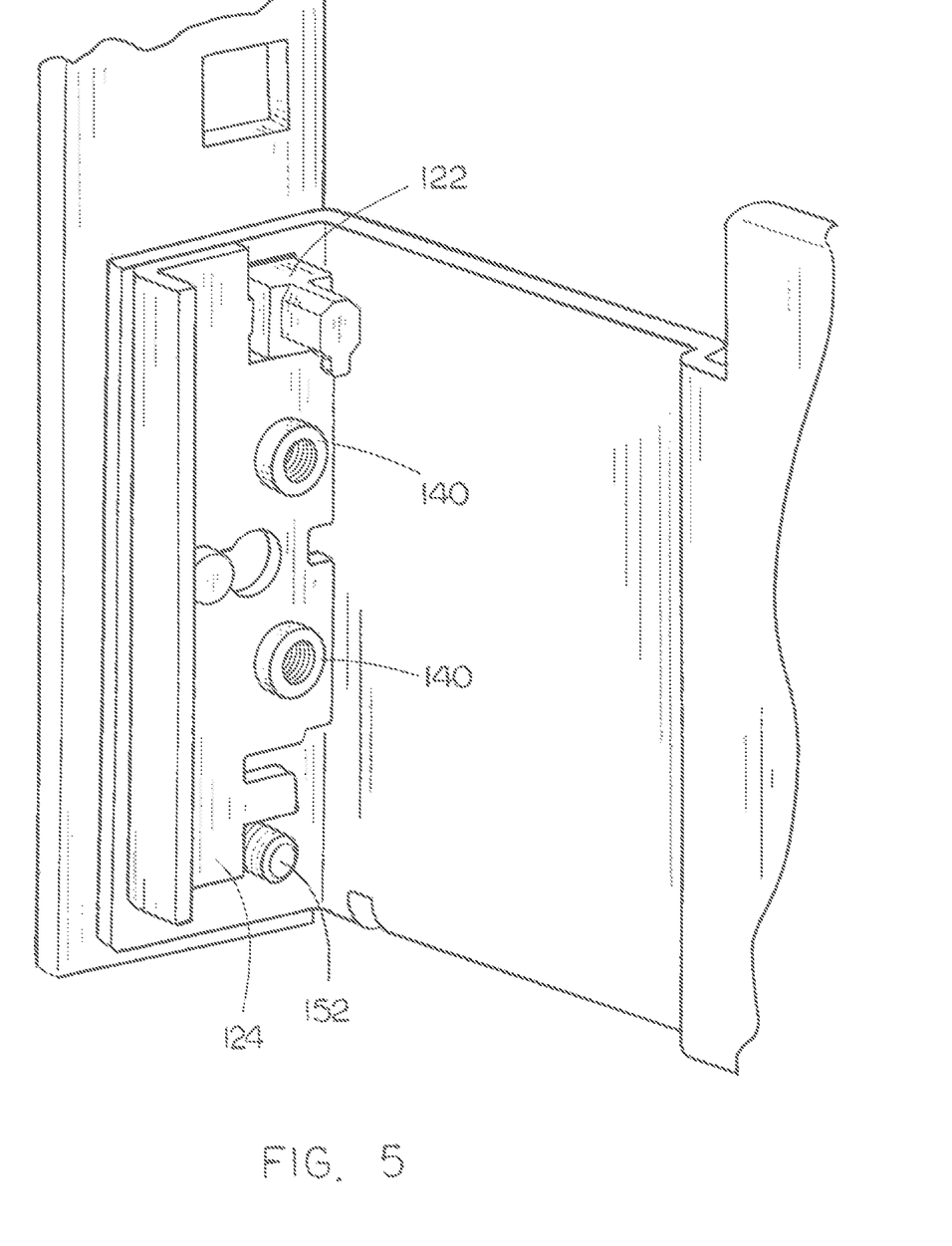
FIG. 5 is another partial isometric view of the end of the support rail aligned and secured to the vertical column illustrated in FIG. 4.

In one embodiment, each rail assembly includes a support rail 120, a pair of aligners 122 and a pair of mounting plates 124. Each support rail 120 is configured to extend between two vertical columns of the rack 106. The aligners 122 are attached to the opposite ends of each support rail 120, and are utilized to align the support rail 120 with the appropriate apertures located on the vertical columns. Once the support rail 120 is aligned between the two columns, fasteners 152 (as illustrated in FIGS. 4 and 5) may be utilized to secure each end of the support rail 120 to the corresponding columns. For example, each end of the support rail 120 may define a threaded hole 154 configured for receiving a screw (e.g., an M4 screw). The screw may pass through an aperture of the column and engage the threaded hole 154 to secure this end to the vertical column.

It is contemplated that the support rail 120 may include two slidably connected portions configured to provide an adjustable length for the support rail 120. Alternatively, the support rail 120 may be configured as a fixed length rail without departing from the spirit and scope of the present disclosure. The support rail 120 may include support panels or shelves 118 for receiving and supporting equipment in the rack.

Each support rail 120 includes two mounting flanges 126A and 126B located on the two opposite ends of the support rail 120. In the example illustrated in FIG. 2, the mounting flange 126A of the support rail in the first rail assembly 102 may be mounted to the vertical column 108, and the mounting flange 126B of the support rail in the first rail assembly 102 may be mounted to the vertical column 110. Similarly, the mounting flange 126A of the support rail in the second rail assembly 104 may be mounted to the vertical column 112, and the mounting flange 126B of the support rail in the second rail assembly 104 may be mounted to the vertical column 114.

Each support rail 120 is associated with a pair of aligners 122. Each one of the pair of aligners 122 is attachable to one of the mounting flanges 126 of the support rail 120. The aligners 122 are utilized for aligning the two opposite ends of the support rail 120 with the corresponding apertures on the vertical columns. Since different racks may provide different types of apertures on the vertical columns, the aligners 122 are not permanently fixed to the support rail 120. Instead, each aligner 122 in accordance with the present disclosure is removably attachable to a mounting flange 126. In this manner, if the aligner 122 currently attached to the mounting flange 126 does not match the aperture on the vertical column, the attached aligner 122 may be removed and replaced with another that better matches the aperture.

It is contemplated that various types of aligners may be provided for engaging with different types of apertures. For example, multiple sets of aligners may be provided with each rail kit package. Each set of aligners may be configured to engage with a particular type of aperture. In this manner, the user installing the rail system may choose the appropriate set of aligners based on the size, shape (e.g., square, rectangular, round or the like), or thread pattern (e.g., threaded or unthreaded) of the apertures on the vertical columns.

Figure 6:
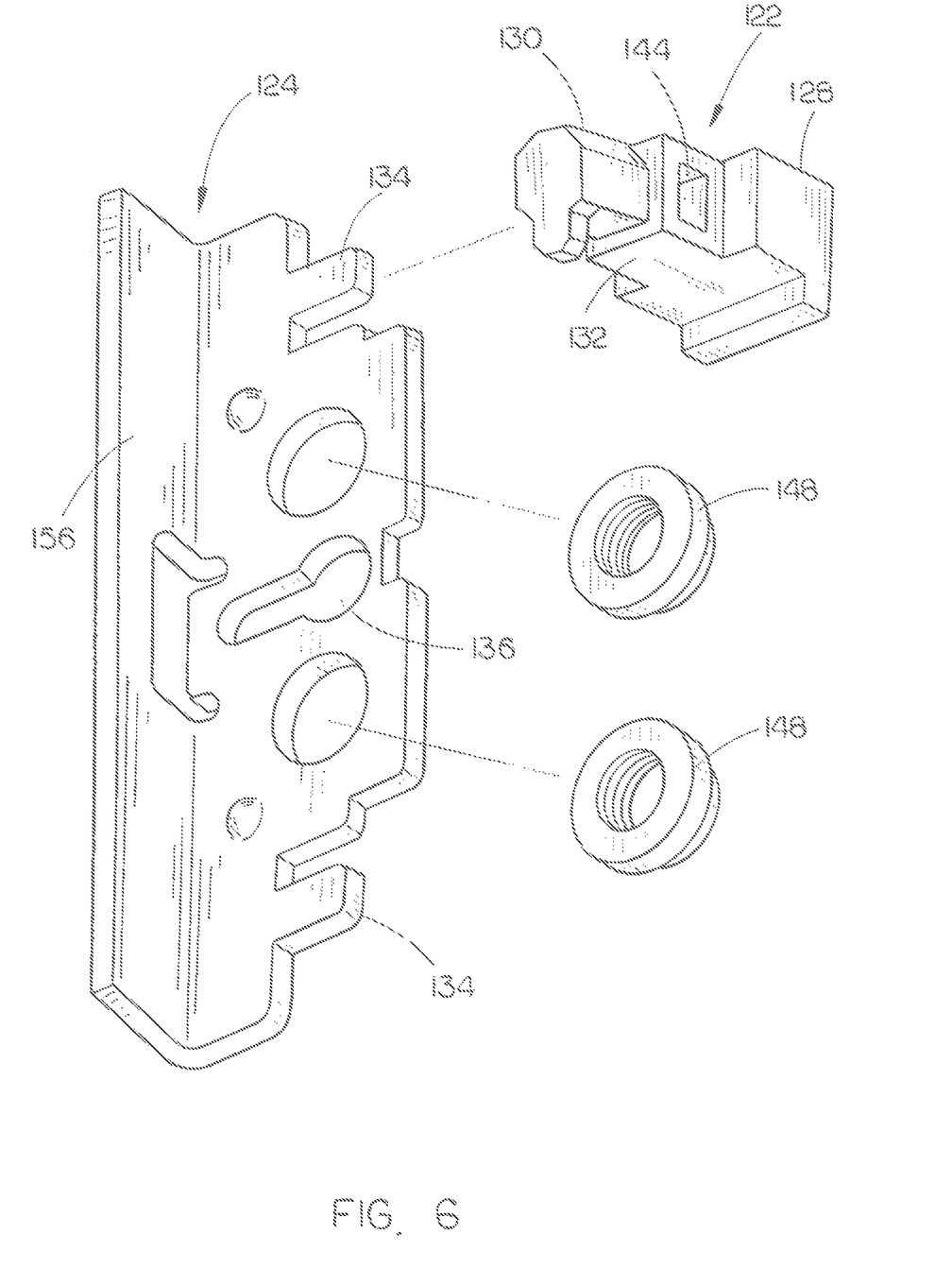
FIG. 6 is an isometric view of a mounting plate and an aligner.

It is also contemplated that the aligners 122 may be designed to be reversible (as illustrated in FIG. 6). That is, each aligner 122 may include a first alignment insert 128 for engaging a first type of vertical column aperture. The aligner 122 may also include a second alignment insert 130 for engaging a second type of vertical column aperture. The first alignment insert 128 and the second alignment insert 130 may be joined together via a connector 132. In this manner, each aligner 122 may support two different types of apertures.

Figure 7:
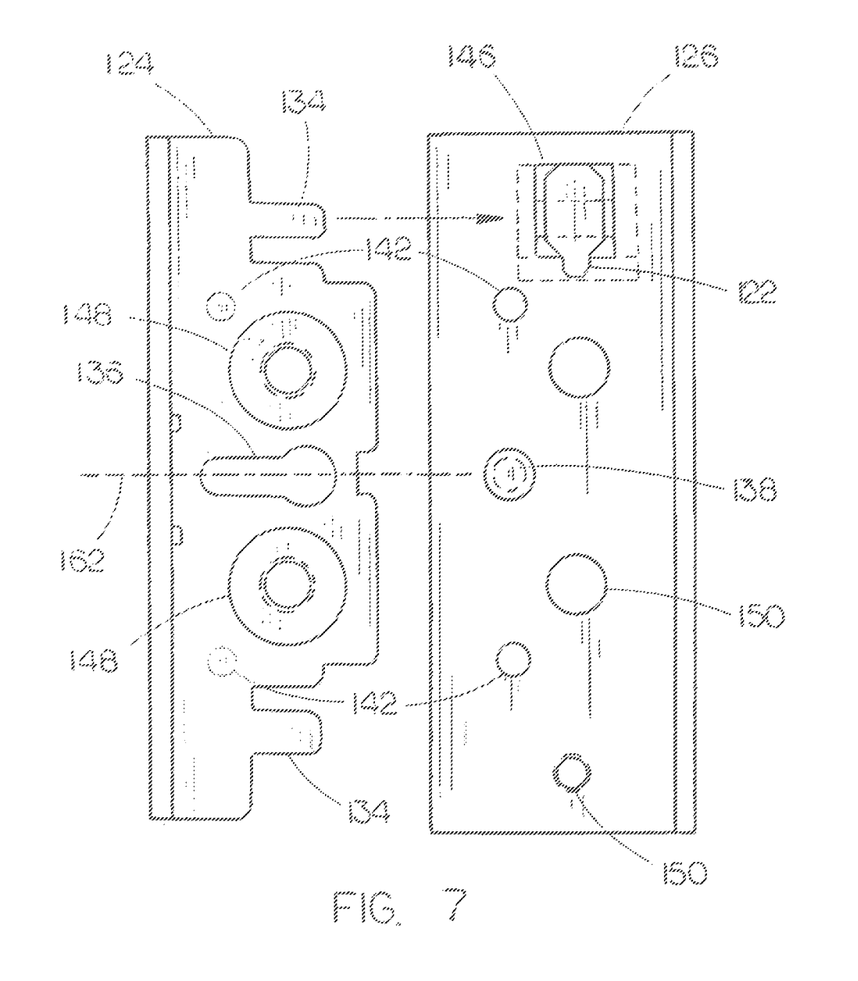
FIG. 7 is an illustration depicting a mounting plate to be attached to a mounting flange at an end of a support rail.
Figure 8:
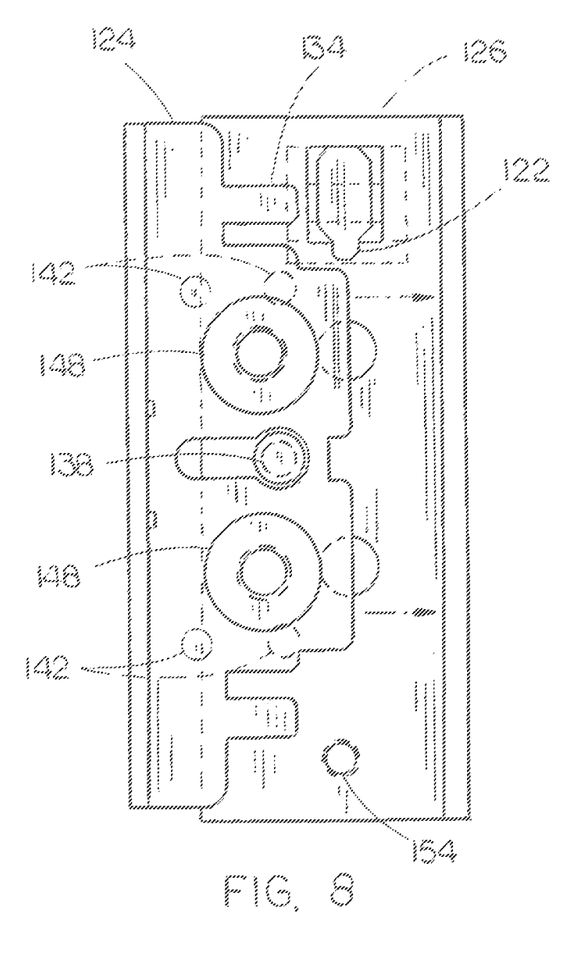
FIG. 8 is an illustration depicting the mounting plate being attached to the mounting flange at an end of the support rail.
Figure 9:
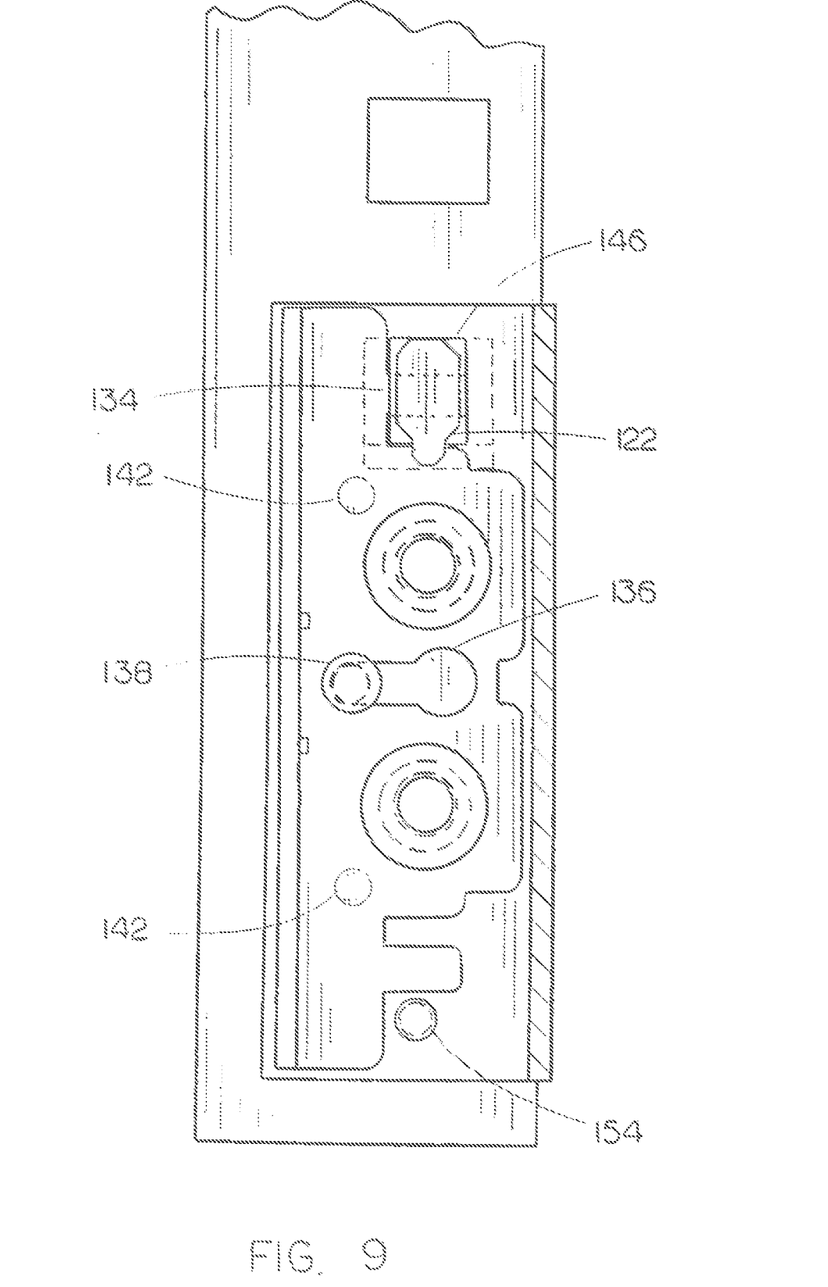
FIG. 9 is an illustration depicting the mounting plate fully attached to the mounting flange at an end of the support rail.

As illustrated in FIGS. 7 through 9, each mounting flange 126 may define an opening 146 for receiving an aligner 122. In addition, a mounting plate 124 may be utilized to secure the aligner 122 to the mounting flanges 126. In one embodiment, each mounting plate 124 defines a guiding slot 136 for engaging with a post 138 located on the mounting flange 126. The mounting plate 124 may slide relative to the mounting flange 126 according to the guiding slot 136. Additional snap-fit alignment mechanisms 142 may be utilized to align and retain the mounting plate 124 once it is slid into the installed position (as depicted in FIG. 9). Sliding the mounting plate 124 into the installed position causes a tab 134 located on the mounting plate 124 to be inserted into a receiver 144 defined on the aligner 122, locking the aligner 122 in place.

To remove the aligner 122, the mounting plate 124 may be removed from the installed position and moved away from the mounting flange 126. Doing so unlocks the aligner 122, allowing the aligner 122 to be removed, reversed or replaced if needed. In one embodiment, to provide better handling for the user to slide the mounting plate 124, the L-shaped plate configuration may include a gripping edge 156. However, it is understood that the L-shaped plate configuration is merely exemplary; mounting plate having various other shapes may be utilized without departing from the spirit and scope of the present disclosure.

It is contemplated that the mounting plate 124 may be designed to be symmetric with respect to a central axis 162. Mounting flange 126A (on one end of the support rail 120) and the mounting flange 126B (on the other end of the support rail 120) may receive their corresponding mounting plates 124 in opposite directions. A symmetric design may allow same mounting plates to be utilized for either end of the support rail 120. That is, the user may simply reverse the vertical orientation of a mounting plate 124 to engage with either the mounting flange 126A or the mounting flange 126B.

Figure 10:
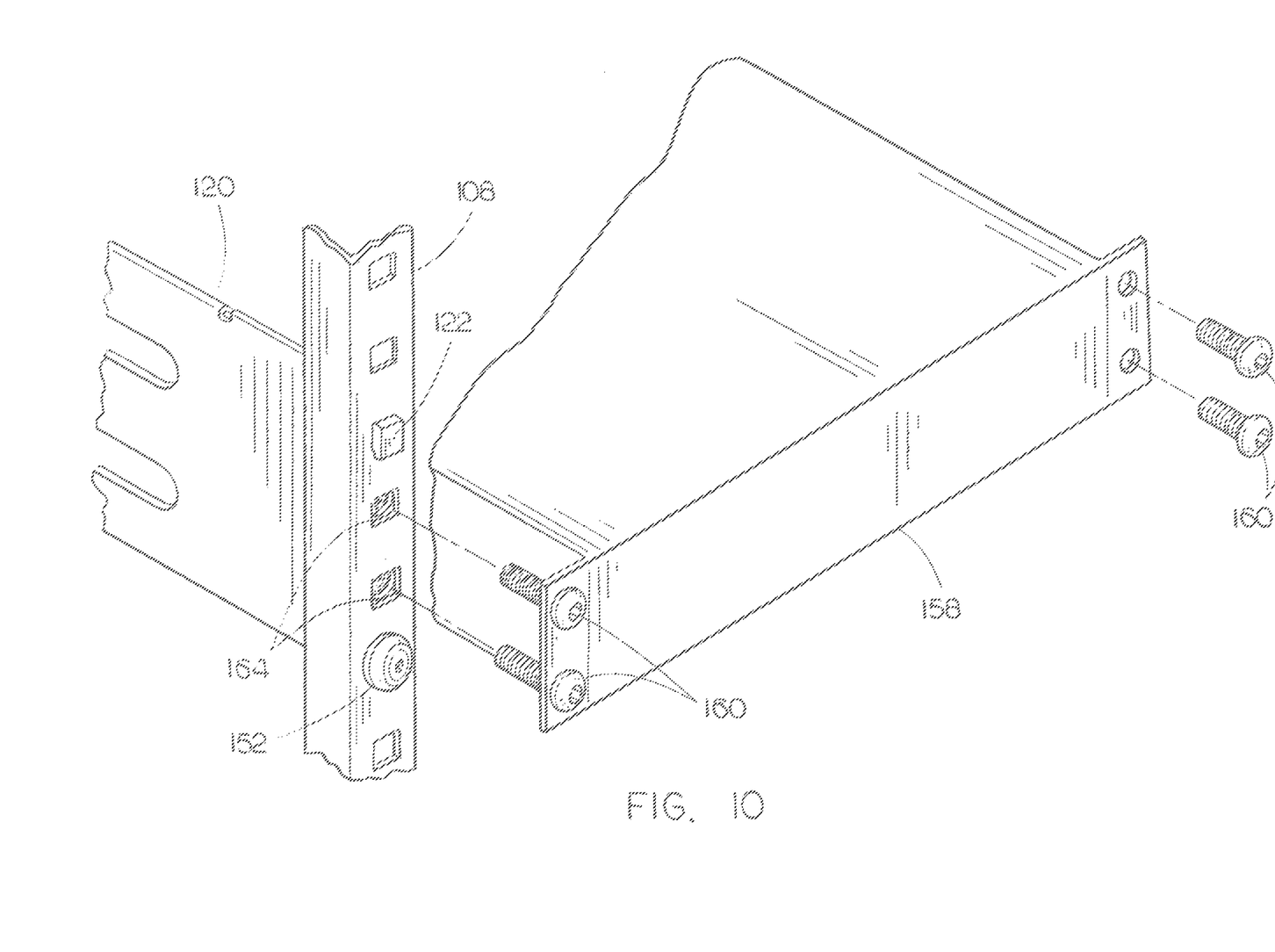
FIG. 10 is a partial isometric view depicting a device supportable in the rack.

Once the support rail assemblies 102 and 104 are securely attached to the rack 106, they may be utilized to support equipment. While the support shelves 118 provided by the support rails may be adequate for supporting certain types of equipment in the rack 106, other types of equipment may need to be coupled to the support rail assemblies for additional security. Referring to FIG. 10, a device/equipment 158 having multiple fasteners 160 that may be secured to the support rail assemblies is shown. To provide support for such devices, each mounting plate 124 may be further configured to define one or more receiving portion for receiving fasteners 160.

Figure 11:
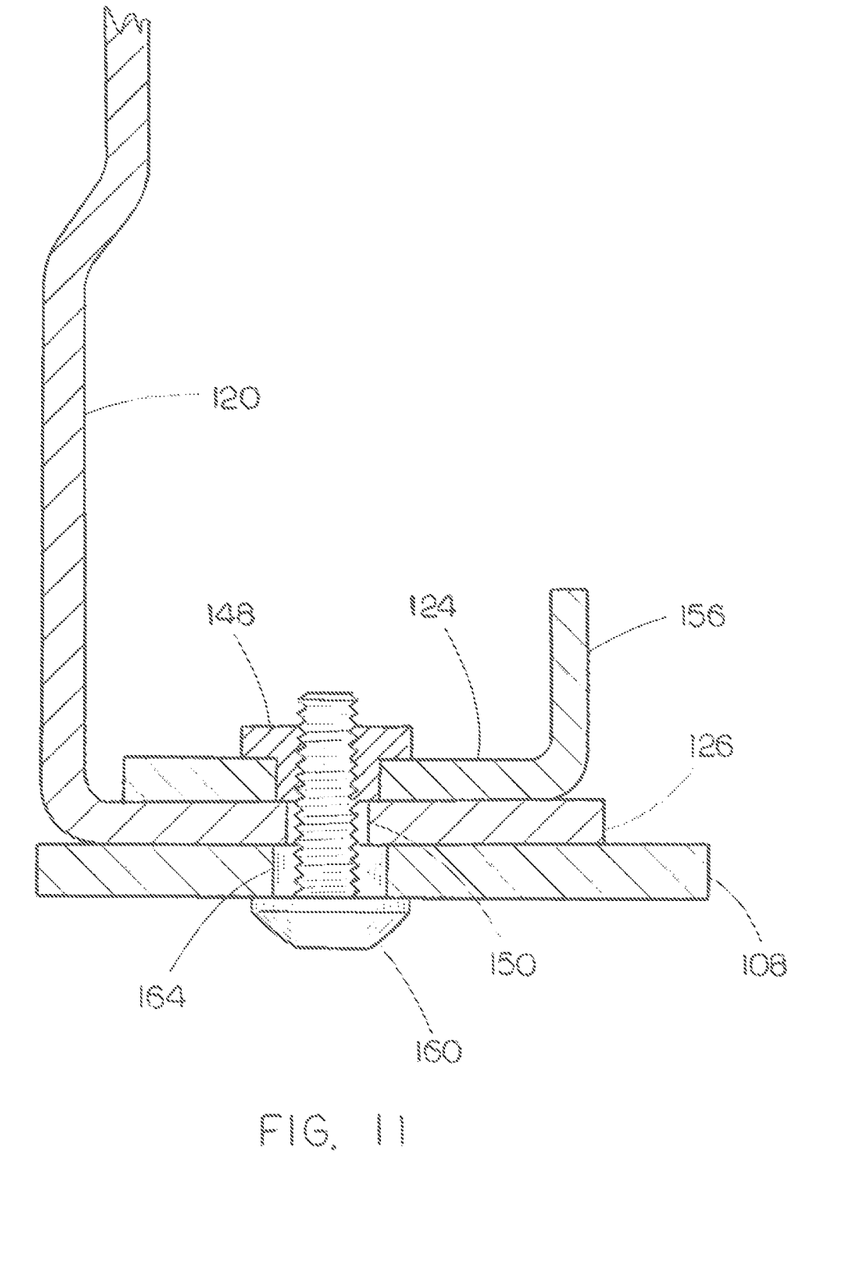
FIG. 11 is a partial cross-sectional view depicting a screw received by a mounting plate attached to an end of a support rail.

As illustrated in FIGS. 7 through 9, each mounting flange 126 may define one or more openings 150 and each mounting plate 124 may define one or more receiving portions 148. The openings 150 on the mounting flange 126 and the receiving portions 148 on the mounting plate 124 are aligned when the mounting plate 124 is placed into the installed position. Furthermore, as illustrated in FIGS. 10 and 11, the openings 150 (already aligned with the receiving portions 148) may coincide with the apertures 164 of the vertical column 108. In this manner, the fasteners 160 may pass through the apertures 164 of the vertical column as well as the openings 150 of the mounting flange 126, and then engage with the receiving portions 148 of the mounting plate 124.

It is contemplated that the fasteners 160 associated with different devices may vary. For example, one device may utilize M5 screws while another may utilize 10-32 screws. To accommodate for various types of screws, multiple sets of mounting plates 124 may be provided. Each set of mounting plates 124 may be configured for receiving a particular type of screw (e.g., M4, M5, 10-32, 12-24 or the like). The user may choose the appropriate set of mounting plates 124 based on the type of fasteners or screws associated with the device. Different mounting plates 124 for receiving different screws may be made visually distinguishable to the user. For example, each mounting plate may include markings to indicate the specific fastener type a mounting plate is configured to receive.

It is also contemplated that various techniques may be employed to produce mounting plates for receiving different screw types. For example, a mold may be provided for each type of mounting plate. Alternatively, as illustrated in FIG. 6, each mounting plate may include separately molded basis plate and receiving portions 148. To produce a mounting plate for receiving a particular type of screw, receiving portions 148 designed for that particular type may be selected and press fit into a basis plate. In this manner, only the receiving portions 148 may need to be produced differently for different types of screws, but the design for the basis plate may remain substantially the same.

Figure 12:
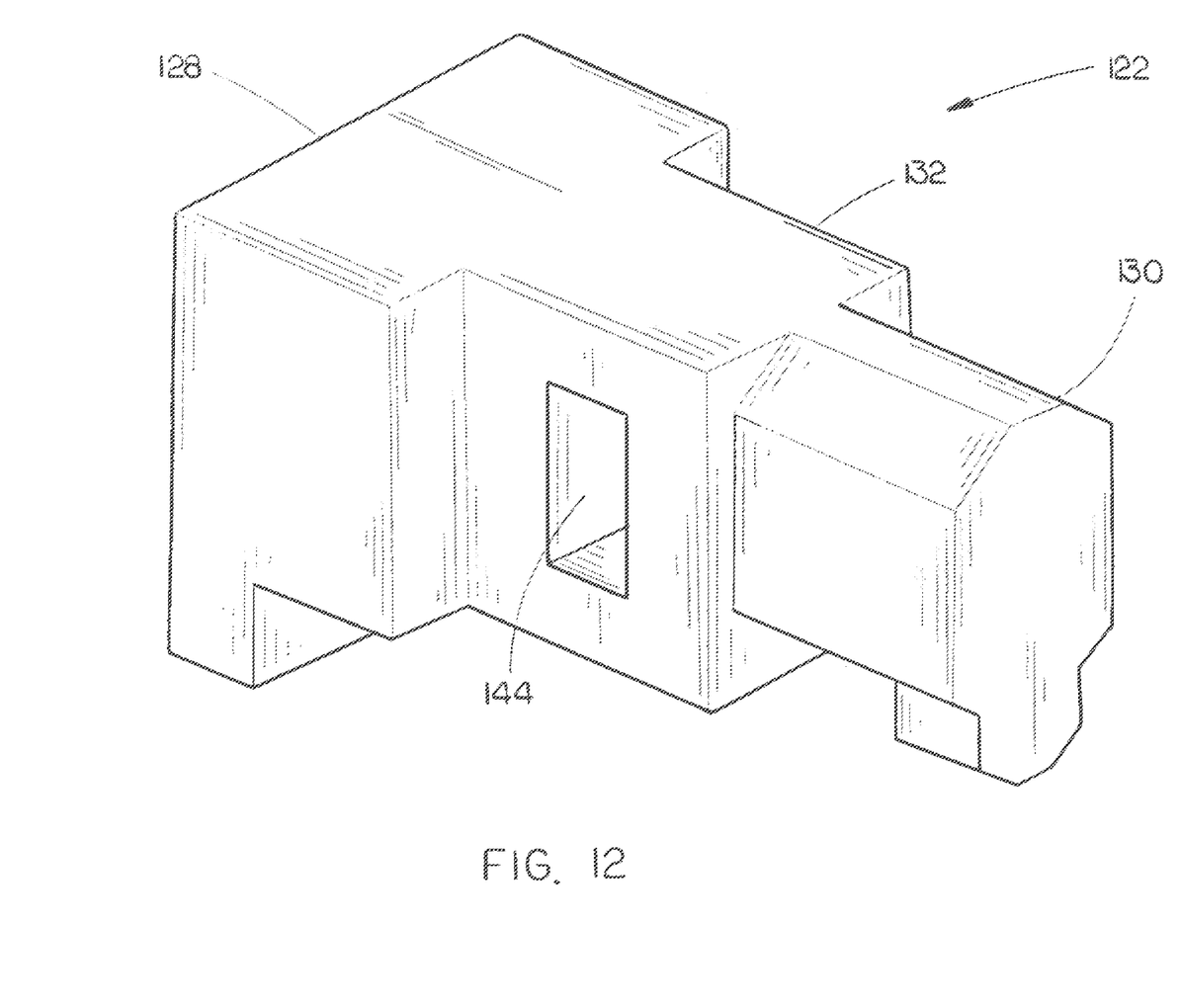
FIG. 12 is an isometric view of a reversible aligner.
Figure 13:
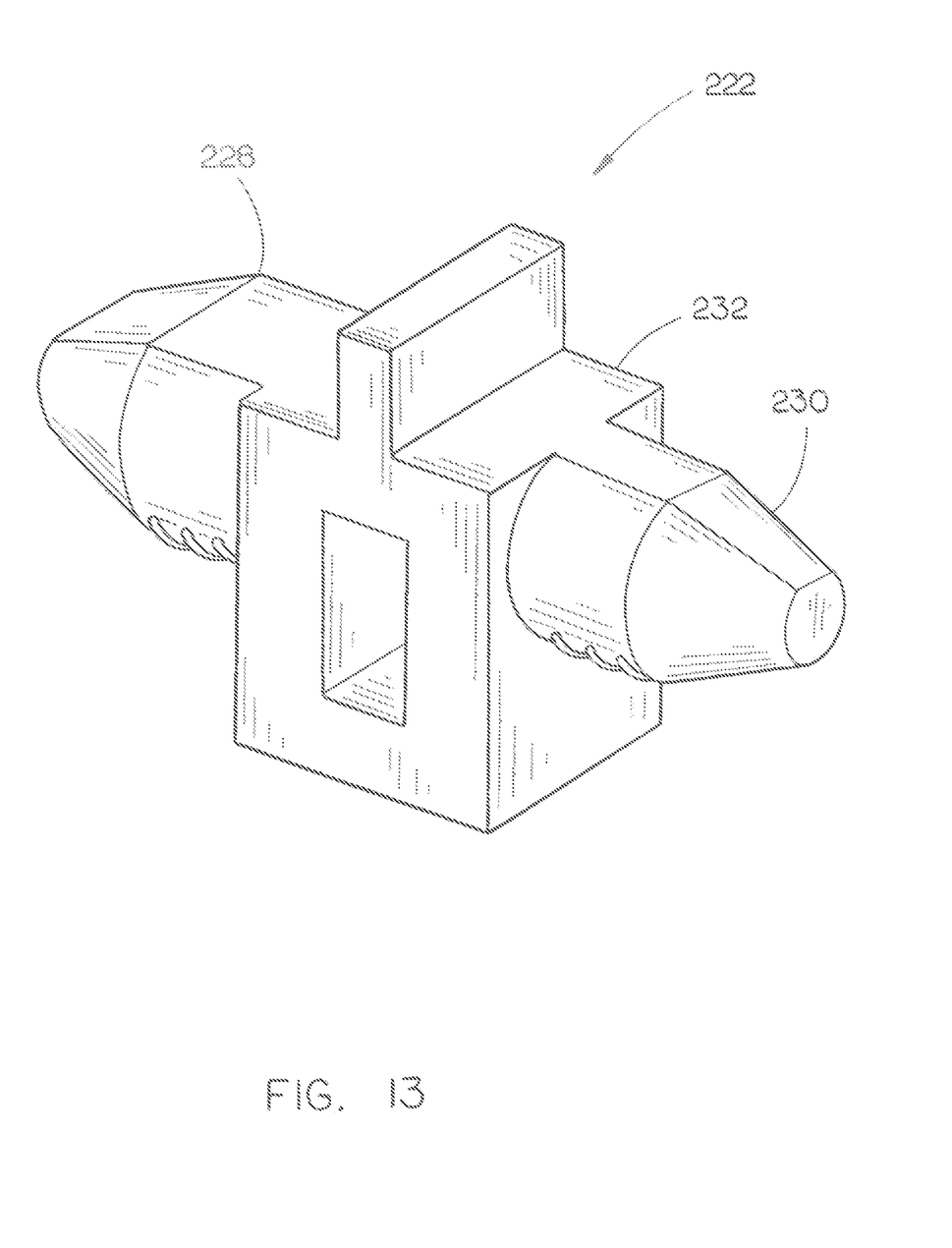
FIG. 13 is an isometric view of another reversible aligner.

FIGS. 12 and 13 illustrate two types of aligners 122 and 222 that may be utilized. As illustrated in FIG. 12, aligner 122 includes a first alignment insert 128 for engaging a square aperture of a first size, a second alignment insert 130 for engaging a square aperture of a second size, and a connector 132 joining the two alignment inserts together. The connector 132 also defines a receiver 144 for receiving a tab from a mounting plate as previously described. Similarly, as illustrated in FIG. 13, aligner 222 includes a first alignment insert 228 for engaging a circular aperture of a first size, a second alignment insert 230 for engaging a circular aperture of a second size, and a connector 232 joining the two alignment inserts together. The alignment inserts 228 and 230 may also include threads for engaging threaded apertures. It is understood that the aligners 122 and 222 are merely exemplary, aligners for engaging various other types of apertures may be utilized without departing from the spirit and scope of the present disclosure.

The rail system 100 in accordance with the present disclosure eliminates the need for different left side and right side assemblies, is allowing the same type of support rails 120 to be used for either side. Furthermore, aligners 122 removably attached to each end of the support rail 120 may accommodate for different vertical column aperture sizes/shapes. In addition, mounting plates 124 utilized to secure the aligners 122 also defines one or more receiving portions for receiving screws from various devices. The mounting plates 124 are designed to be interchangeable in order to accommodate for different screw sizes associated with various types of devices.

It is contemplated that the rail system 100 in accordance with the present disclosure may be packaged as a kit. Each kit may include one or more identical support rail assemblies. Each rail assembly includes a support rail as previously described. Each rail assembly also includes one or more pairs of aligners. More than one pair of aligners may be included to allow the user to select the appropriate ones that best fit the vertical column apertures. Each rail assembly further includes one or more pairs of mounting plates. More than one pair of mounting plates may be included to allow the user to select the appropriate ones based on the type of screws used by the equipment. For instance, each rail assembly may include four pairs of mounting plates that are configured for receiving M4, M5, 10-32, and 12-24 screw types respectively.

The rail kit in accordance with the present disclosure may be utilized with any type of rack manufactured by various manufactures/sellers.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A rail system for supporting equipment in a rack, the rack including a plurality of vertical columns, each one of the plurality of vertical columns defining a plurality of apertures, the rail system comprising:
 a first support rail assembly configured to extend between a pair of vertical columns of the rack;
 a second support rail assembly configured to extend between a different pair of vertical columns of the rack;
 each one of the first support rail assembly and the second support rail assembly comprising:
  a support rail having opposite ends;
  aligners configured to align the opposite ends of the support rail with apertures of the vertical columns; and
  mounting plates configured to removably secure the aligners to the opposite ends of the support rail;
 wherein at least one aligner of the aligners is a reversible aligner, the reversible aligner comprises:
  a first alignment insert for engaging a first type of vertical column aperture;
  a second alignment insert for engaging a second type of vertical column aperture; and
  a connector attaching the first alignment insert to the second alignment insert, the connector defining a receiver for receiving a tab of a mounting plate which allows the mounting plate to removably secure the aligner.

2. The rail system of claim 1, wherein at least one mounting plate of the mounting plates is configured to define at least one receiving portion for receiving a fastener for securing an equipment supportable in the rack.

3. The rail system of claim 2, wherein at least one mounting plate of the mounting plates is configured to receive at least one of: an M5 screw, an M6 screw, a 10-32 screw, and a 12-24 screw.

4. The rail system of claim 2, wherein at least one end of the opposite ends of the support rail is configured to define at least one opening, the at least one opening is configured to allow the fastener for securing the equipment to pass through.

5. The rail system of claim 1, wherein at least one end of the opposite ends of the support rail is configured to define a threaded hole for receiving a screw, the screw is utilized to secure this end of the support rail to a vertical column.

6. The rail system of claim 1, wherein at least one mounting plate of the mounting plates is symmetric with respect to a central axis.

7. A rail system for supporting equipment in a rack, the rack including a plurality of vertical columns, each one of the plurality of vertical columns defining a plurality of apertures, the rail system comprising:
 a first support rail having opposite ends, the first support rail configured to extend between a first pair of vertical columns of the rack;
 a second support rail having opposite ends, the second support rail configured to extend between a second pair of vertical columns of the rack, the second support rail being oriented in an opposing side with respect to the first support rail;
 a first set of aligners configured to align the opposite ends of the first support rail with apertures located on the first pair of vertical columns;

a second set of aligners configured to align the opposite ends of the second support rail with apertures located on the second pair of vertical columns;

a first set of mounting plates configured to removably secure the first set of aligners to the opposite ends of the first support rail, each one of the first set of mounting plates further configured to define at least one receiving portion for receiving a fastener for securing an equipment supportable in the rack; and a second set of mounting plates configured to removably secure the second set of aligners to the opposite ends of the second support rail, each one of the second set of mounting plates further configured to define at least one receiving portion for receiving a fastener for securing the equipment supportable in the rack;

wherein the first set of aligners and the second set of aligners are reversible aligners, each reversible aligner comprises:

a first alignment insert for engaging a first type of vertical column aperture;

a second alignment insert for engaging a second type of vertical column aperture; and a connector joining the first alignment insert and the second alignment insert, the connector defining a receiver portion for receiving a tab of a mounting plate which allows the mounting plate to removably secure the aligner.

8. The rail system of claim 7, wherein the first set of aligners and the second set of aligners are substantially identical.

9. The rail system of claim 7, wherein the first set of mounting plates and the second set of mounting plates are substantially identical.

10. The rail system of claim 7, wherein at least one end of the opposite ends of the first support rail and the opposite ends of the second support rail is configured to define at least one opening, the at least one opening is configured to allow the fastener for securing the equipment to pass through.

11. The rail system of claim 7, wherein at least one end of the opposite ends of the first support rail and the opposite ends of the second support rail is configured to define a threaded hole for receiving a screw, the screw is utilized to secure said particular end to a vertical column.

12. The rail system of claim 7, wherein at least one mounting plate of the first set of mounting plates and the second set of mounting plates is configured to receive at least one of: an M5 screw, an M6 screw, a 10-32 screw, and a 12-24 screw.

13. The rail system of claim 7, wherein at least one mounting plate of the first set of mounting plates and the second set of mounting plates is symmetric with respect to a central axis.

14. A support rail assembly for installation in a rack, the support rail assembly comprising:

a support rail having opposite ends, the support rail configured to extend between a pair of vertical columns of the rack;

a set of aligners configured to align the opposite ends of the support rail with a first type of vertical column aperture; and a set of mounting plates configured to removably secure the set of aligners to the opposite ends of the support rail, each one of the set of mounting plates further configured to define at least one receiving portion for receiving a first type of fastener for securing an equipment supportable in the rack wherein each one of the set of aligners is a reversible aligner, each reversible aligner comprises:

a first alignment insert for engaging a first type of vertical column aperture;

a second alignment insert for engaging a second type of vertical column aperture; and a connector attaching the first alignment insert to the second alignment insert, the connector defining a receiver portion for receiving a tab of a mounting plate which allows the mounting plate to removably secure the aligner.

15. The support rail assembly of claim 14, further comprising a second set of aligners configured to align the opposite ends of the support rail with a second type of vertical column aperture.

16. The support rail assembly of claim 14, further comprising a second set of mounting plates configured to removably secure the set of aligners to the opposite ends of the support rail, each one of the second set of mounting plates further configured to define at least one receiving portion for receiving a second type of fastener for securing the equipment supportable in the rack.

17. The support rail assembly of claim 14, wherein each one of the set of mounting plates is configured to receive at least one of: an M5 screw, an M6 screw, a 10-32 screw, and a 12-24 screw.

* * * * *